(12) United States Patent
Kundalgurki et al.

(10) Patent No.: US 8,993,451 B2
(45) Date of Patent: Mar. 31, 2015

(54) ETCHING TRENCHES IN A SUBSTRATE

(75) Inventors: Srivatsa G. Kundalgurki, Austin, TX (US); James F. McHugh, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 57 days.

(21) Appl. No.: 13/088,106

(22) Filed: Apr. 15, 2011

(65) Prior Publication Data
US 2012/0264307 A1 Oct. 18, 2012

(51) Int. Cl.
| | |
|---|---|
| *H01L 21/302* | (2006.01) |
| *H01L 21/02* | (2006.01) |
| *H01L 21/306* | (2006.01) |
| *H01L 21/308* | (2006.01) |
| *H01L 21/265* | (2006.01) |
| *B81C 1/00* | (2006.01) |

(52) U.S. Cl.
CPC .... *H01L 21/02057* (2013.01); *H01L 21/30608* (2013.01); *H01L 21/3083* (2013.01); *H01L 21/26506* (2013.01); *B81C 1/00063* (2013.01); *B81C 1/00626* (2013.01); *B81C 2201/0136* (2013.01)
USPC ..................... 438/705; 257/E21.214; 216/87

(58) Field of Classification Search
None
See application file for complete search history.

(56) References Cited

U.S. PATENT DOCUMENTS

| | | | | |
|---|---|---|---|---|
| 4,606,113 A | * | 8/1986 | Rode ............................ | 438/167 |
| 4,889,590 A | * | 12/1989 | Tucker et al. .................. | 438/53 |
| 5,118,636 A | * | 6/1992 | Hosaka ........................ | 438/421 |
| 5,314,833 A | * | 5/1994 | Lee et al. ...................... | 438/174 |
| 5,668,044 A | * | 9/1997 | Ohno ............................ | 438/433 |
| 6,066,874 A | * | 5/2000 | Lin et al. ...................... | 257/315 |
| 6,261,964 B1 | * | 7/2001 | Wu et al. ...................... | 438/705 |
| 6,262,444 B1 | * | 7/2001 | Hori et al. ..................... | 257/192 |
| 6,284,626 B1 | * | 9/2001 | Kim .............................. | 438/433 |
| 6,599,840 B2 | * | 7/2003 | Wu et al. ...................... | 438/705 |
| 6,866,986 B2 | * | 3/2005 | Chun et al. .................... | 430/311 |
| 7,045,073 B2 | * | 5/2006 | Hareland et al. ............... | 216/87 |
| 7,625,776 B2 | * | 12/2009 | Wells et al. .................... | 438/68 |
| 7,989,299 B2 | * | 8/2011 | Fukutome et al. ............ | 438/300 |
| 8,030,157 B1 | * | 10/2011 | Hichri et al. .................. | 438/248 |
| 8,138,050 B2 | * | 3/2012 | Papageorgiou et al. ...... | 438/286 |
| 8,460,569 B2 | * | 6/2013 | Godet et al. ................... | 216/87 |
| 2002/0179921 A1 | * | 12/2002 | Cohn ............................. | 257/99 |
| 2002/0187648 A1 | * | 12/2002 | Wu et al. ...................... | 438/745 |
| 2003/0045079 A1 | * | 3/2003 | Han .............................. | 438/585 |
| 2003/0099766 A1 | * | 5/2003 | Jurczak et al. ................. | 427/58 |
| 2003/0211738 A1 | * | 11/2003 | Nagata .......................... | 438/689 |
| 2004/0005764 A1 | * | 1/2004 | Wu et al. ...................... | 438/400 |
| 2004/0009437 A1 | * | 1/2004 | Chun et al. .................... | 430/315 |
| 2004/0118805 A1 | * | 6/2004 | Hareland et al. ............... | 216/13 |
| 2005/0009264 A1 | * | 1/2005 | Ryu .............................. | 438/221 |

(Continued)

*Primary Examiner* — Allan Olsen
(74) *Attorney, Agent, or Firm* — Ingrassia Fisher & Lorenz, P.C.

(57) ABSTRACT

Etch stabilizing ions (37) are introduced, e.g., by ion implantation (34), into a portion (36) of a substrate (20) underlying an etch window (24) in a masking layer (22) covering the substrate (20), where a trench (26) is desired to be formed. When the portion (36) of the substrate (20) containing the etch stabilizing ions (37) is etched to form the trench (26), the etch stabilizing ions (37) are progressively released at the etch interface (28') as etching proceeds, substantially preventing gas micro-bubbles or other reaction products at the etch interface (28') from disrupting etching. Using this method (700), products containing trenches (26) are much more easily formed and such trenches (26) have much smoother interior surface (28).

17 Claims, 4 Drawing Sheets

(56) References Cited

U.S. PATENT DOCUMENTS

| | | | |
|---|---|---|---|
| 2005/0029123 A1* | 2/2005 | Uzoh et al. | 205/655 |
| 2005/0054136 A1* | 3/2005 | Blanchard | 438/53 |
| 2005/0064678 A1* | 3/2005 | Dudek et al. | 438/424 |
| 2005/0124167 A1* | 6/2005 | Nevin et al. | 438/700 |
| 2005/0285203 A1* | 12/2005 | Fukutome et al. | 257/368 |
| 2006/0170915 A1* | 8/2006 | Nakamura et al. | 356/246 |
| 2007/0052046 A1* | 3/2007 | Chu et al. | 257/415 |
| 2007/0126067 A1* | 6/2007 | Hattendorf et al. | 257/412 |
| 2007/0218585 A1* | 9/2007 | Robert | 438/106 |
| 2007/0232039 A1* | 10/2007 | Kubo et al. | 438/527 |
| 2008/0057668 A1* | 3/2008 | Okamura | 438/424 |
| 2008/0160720 A1* | 7/2008 | Ryu et al. | 438/433 |
| 2008/0286892 A1* | 11/2008 | Wang et al. | 438/31 |
| 2009/0057788 A1* | 3/2009 | Hattendorf et al. | 257/412 |
| 2009/0174002 A1* | 7/2009 | Ouyang et al. | 257/369 |
| 2009/0245314 A1* | 10/2009 | Yamamoto et al. | 372/50.1 |
| 2010/0081244 A1* | 4/2010 | Papageorgiou et al. | 438/286 |
| 2010/0109120 A1 | 5/2010 | Fucsko et al. | |
| 2010/0311218 A1* | 12/2010 | Fukutome et al. | 438/300 |
| 2011/0121386 A1* | 5/2011 | Hsieh | 257/334 |
| 2012/0264249 A1* | 10/2012 | Kundalgurki et al. | 438/50 |
| 2013/0049129 A1* | 2/2013 | Feng et al. | 257/369 |

* cited by examiner

ETCHING TRENCHES IN A SUBSTRATE

FIELD OF THE INVENTION

Embodiments of this invention relate generally to arrangements and methods for etching trenches in substrates, especially semiconductor wafers, and products embodying such trenches.

BACKGROUND OF THE INVENTION

It is commonplace in the electronic arts, especially semiconductor arts, to etch trenches of various depths into substrates on which various electronic devices and/or integrated circuits (ICs) and/or micro-electro-mechanical system ("MEMS") elements are being fabricated. Of particular interest are trenches whose dimensions (e.g., width and depth) are of the order of a few micrometers and where at least one of the dimensions of the trench opening is significantly smaller than the others. In this realm special etching problems can be encountered.

BRIEF DESCRIPTION OF THE DRAWINGS

Embodiments of the invention will be better understood from a reading of the following detailed description, taken in conjunction with the accompanying figures in the drawings in which like numerals denote like or analogous elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawings and figures illustrate the general manner of construction, and descriptions and details of well-known features and techniques may be omitted to avoid unnecessarily obscuring the invention. Additionally, elements in the drawings and figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the terms "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "substrate wafer" are intended to include single crystal structures, polycrystalline structures, amorphous structures, thin film structures, layered structures as for example and not intended to be limiting, combinations of dielectric and SC layers or materials including but not limited to semiconductor-on-insulator (SOI) structures, and/or combinations thereof. For convenience of explanation and not intended to be limiting, electronic structures and methods of fabrication are described herein for substrates employing silicon, but persons of skill in the art will understand that other semiconductors and composite materials may also be used. The terms "cavity" and "micro-cavity", singular or plural, are sometimes used in the art to refer to recesses or holes of various depths in a substrate. As used herein, the more general term "trench", singular or plural, is intended to include the terms cavity, micro-cavity, recess or hole, singular or plural.

In some embodiments, it is important for efficient and low cost manufacturing of electronic products embodying trenches that the trench etching be well controlled and repeatable, and be able to be performed, if necessary, when other materials (e.g. interconnections), devices and/or other elements may already be present on the substrate. The presence of such other elements or materials on the substrate can greatly complicate the trench etching process. Further, the etching process can become more difficult to control if the desired trenches have narrow openings, are shallow and/or their surface smoothness is an important consideration. Etching trenches with a narrow fluid opening introduces difficulties in fluid transport in and out of the opening and hence special considerations have to be given to controlling concentration and surface tension properties of the etchant. On the other hand, if the desired trench etch depth is small relative to the feature's lateral dimensions, reactant depletion and incubation effects strongly influence cavity trench etch performance. If not resolved or avoided, these etching difficulties can have an important influence on the performance and cost of the finished products embodying such trenches.

Figure 1:
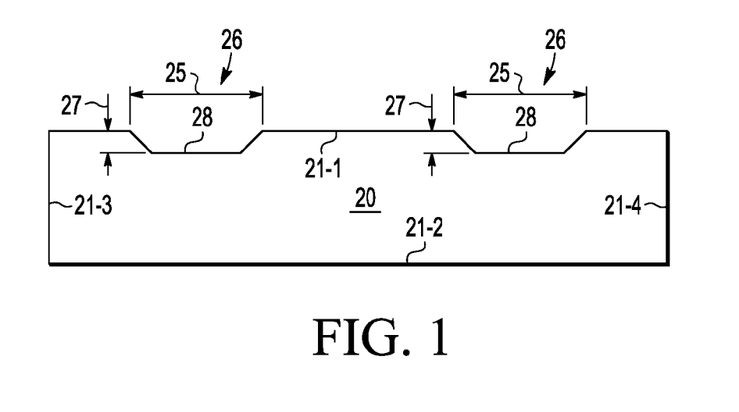
FIG. 1 is a simplified cross-sectional view of a substrate in which a number of shallow trenches have been formed.

FIG. 1 is a simplified cross-sectional view of substrate 20 with principal surfaces 21-1, 21-2 and end surfaces 21-3, 21-4, collectively making up surfaces 21. A number of shallow trenches 26 of width 25 and with interior (e.g., bottom) surface 28 at depth 27 have been formed in principal surface 21-1. Although not shown in FIG. 1, substrate 20 may or may not have various electronic devices (e.g., transistors, resistors, capacitors, optical elements, etc.) and/or MEMS elements (e.g., transducers, sensors, isolators, actuators, etc.) and various materials (e.g., metal interconnects and dielectric interlayers, etc.) used with such devices and/or MEMS elements, that extend to or over surfaces 21. The devices and/or MEMS elements may be interconnected to form various integrated circuits (ICs) on substrate 20. The etching process described in various embodiments herein does not depend upon the exact nature of such materials and/or devices and/or MEMS elements and/or ICs. Widths 25 are usefully in the range of about 100 to 2000 micrometers, conveniently in the range of about 500 to 1200 micrometers, and preferably for many applications in the range of about 650 to 1150 micrometers, but larger and smaller widths may also be used. Depths 27 are usefully in the range of about 2 to 50 micrometers, conveniently in the range of about 2 to 30 micrometers, and preferably for many applications in the range of about 2 to 25 micrometers, but larger and smaller depths may also be used.

FIGS. 2-7 are simplified cross-sectional views of substrate 20 of FIG. 1 during various manufacture stages 202-207 and illustrating resulting structures 302-307, according to an embodiment of the present invention. Referring now to manufacturing stage 202 of FIG. 2, wafer 20 having principal surfaces 21-1, 21-2 and end surfaces 21-3, 21-4, collectively surfaces 21, is provided. Surfaces 21 are desirably covered by dielectric layer 22 of thickness 23. Dielectric layer 22 may (as shown) cover substantially all of surfaces 21 or may be limited to just those portions of surfaces 21 that need to be protected during subsequent operations. Either arrangement is useful. While silicon oxide is preferred, silicon oxide, silicon nitride and combinations thereof are examples of suitable materials for dielectric layer 23, but other materials resistant to the etchants used to etch substrate 20 to form trenches 26 therein may also be used. Thickness 23 is usefully in the range of about 20 nanometers to 1 micrometer, conveniently in the range of about 20 nanometers to 0.75 micrometers and preferably about 0.5 micrometers, but thicker and thinner layers may also be used depending upon the material chosen for layer 23 and the etchant used for the substrate 20. Structure 302 results from manufacturing stage 202.

Figure 3:
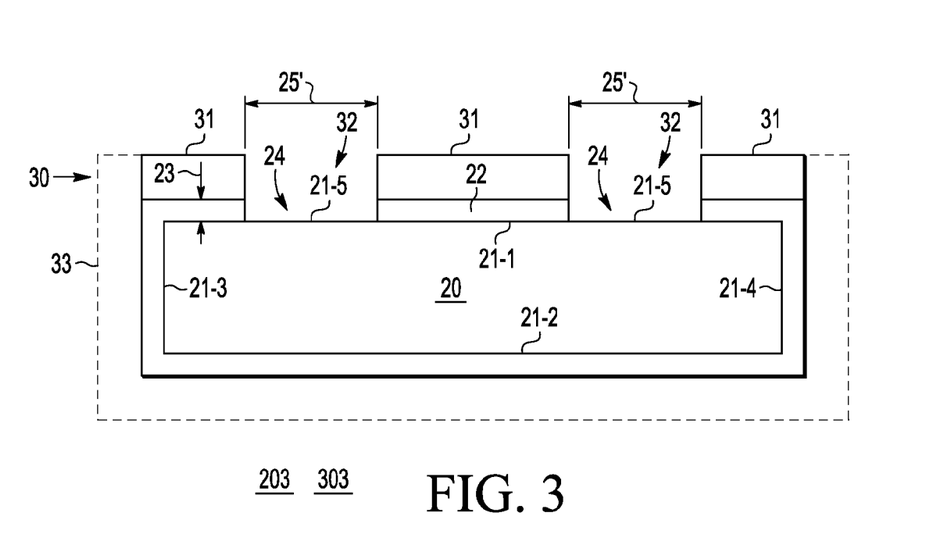

Referring now to manufacturing stage 203 of FIG. 3, mask 30 is provided at least on principal surface 21-1, having closed portions 31 and open portions 32 of widths 25' corresponding substantially to the desired location and widths 25 of trenches or micro-cavities 26 of FIG. 1. Photo-resist is an example of a suitable material for mask 30, but other soft or hard mask materials well known in the art may also be used. In other embodiments, mask 30 may also have portion 33 extending around some or all of ends 21-3, 21-4 and (e.g., rear) principal surface 21-2 of substrate 20, but this is not essential in some embodiments. Those portions of dielectric layer 22 exposed in open portions 32 of mask 30 are removed, for example by anisotropic etching, to create one or more etch windows 24 in dielectric layer 22 that expose underlying portions 21-5 of principal surface 21-1 of substrate 20. Etch windows 24 in dielectric layer 22 are placed at locations where trench or micro-cavities 26 of FIG. 1 are desired to be formed. Wet or dry reagents suitable for etching dielectric layer 22 are well known in the art. Gaseous dry etch $C_xH_yF_z$ and $NF_3$, and buffered wet etch $HF:NH_4F:H_2O$ reagents are preferred. Structure 303 results from manufacturing stage 203.

Figure 4:
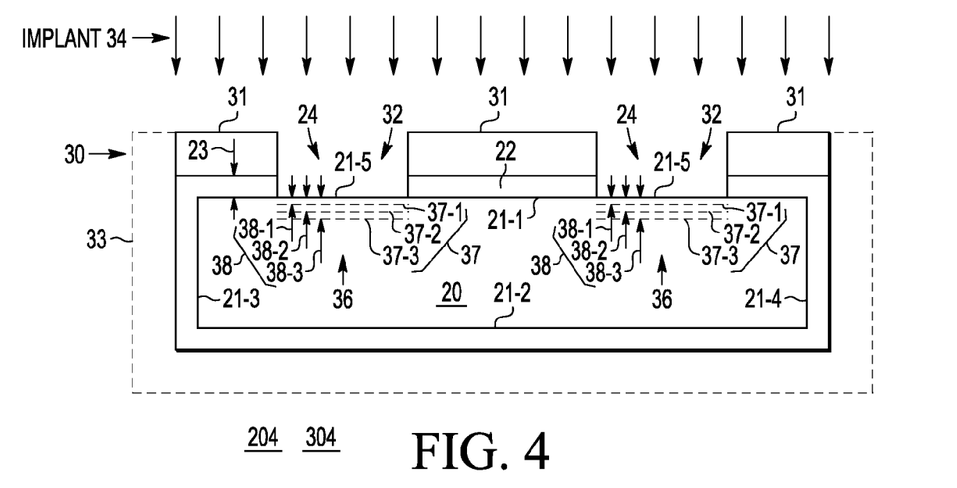

Referring now to manufacturing stage 204 of FIG. 4, structure 303 is desirably exposed to Implant 34 to introduce ions 37-1, 37-2, 37-3 (collectively 37) of Implant 34 into portion 36 of substrate 20 underlying mask window 24 (or mask opening 32 or both). Manufacturing stages 205 of FIGS. 5 and 206 of FIG. 6 illustrate progressive stages of etching trenches or micro-cavities 26 into substrate 20 after implant stage 204. Referring again to manufacturing stage 204 of FIG. 4, a significant concentration of implanted ions 37-1, 37-2, 37-3 (collectively 37) is present at various depths 38-1, 38-2, 38-3 (collectively 38) below surface 21-5, depending upon the implant energy and dose. Even if only a single energy implant is used, ions 37 will be distributed in depth 38 beneath surface 21-5, but greater control over depths 38 of ions 37 may be obtained by performing Implant 34 at various energies. For convenience of illustration, mask 30 is shown as being left in place during manufacturing stage 204. However, in various embodiments, mask 30 may be left in place or removed, depending upon the energy of Implant 34 and thickness 23 of dielectric layer 22. Where thickness 23 is sufficient by itself to block Implant 34, mask 30 is not needed and may be removed prior to Implant 34. Either arrangement is useful. Structure 304 results from manufacturing stage 204.

The purpose of Implant 34 is to stabilize etching of portion 36 of substrate 20 underlying window 24. Etching of substrate 20 underlying window 24 depends upon the active ingredients in the etchant solution applied to substrate 20 through etch window 24 in manufacturing stages 205-207 of FIGS. 5-7 being able to reach initial etch surface 21-5 and subsequent etch interfaces 28-1', 28-2' (collectively 28') shown in FIGS. 5-6. As etching proceeds (see FIGS. 5-6), etch reaction products are created at etch interface 28'. If such etch reaction products interfere with fresh active ingredients in the etchant solution reaching etch interface 28', etching can be erratic and difficult to control.

For example, it has been found that in the case of substrates comprising type IV semiconductors, as for example silicon, that hydrogen micro-bubbles can be released at etch interface 28'. Tetra-methyl-ammonium hydroxide (TMAH) is a useful semiconductor (e.g. silicon) etchant that exhibits this property. TMAH is available from Air Products and Chemicals, Inc., Allentown, Pa., USA. The hydrogen micro-bubbles can act like a gas curtain inhibiting diffusion of fresh active etchant ingredients to etch interface 28'. Also, dissolved oxygen in TMAH may interact with exposed etch interface 28' leading to the formation of etch inhibiting oxides or other etching by-products at etch interface 28'. The combination of micro-bubble evolution and formation of etch inhibiting oxides or other etching by-products can disrupt the etching process making it hard to control. Unexpectedly, the problem gets worse as desired depth 27 of trenches or micro-cavities 26 is reduced, for example, due to etch incubation effects. When relatively shallow trenches (e.g., of the order of a few micrometers depth or less) are being formed, the etching process can be erratic so that etching depth and etched surface texture are more difficult to control. Conventional approaches (e.g., using high velocity etchant jets or violent stirring near the etch interface, etc.) to break up the gas curtain or other tenacious reaction by-product layers are difficult to apply when etching relatively delicate electronic substrates to form relatively shallow trenches, especially when such substrates already include or are later processed to include other electronic devices and/or ICs and/or interconnections and/or MEMS elements. Accordingly, a new approach has been needed.

It has been discovered that such adverse etch effects encountered when trying to form relatively shallow trenches in electronic substrates can be substantially reduced or eliminated by including etch stabilizing ions 37 in portion 36 of substrate 20 that is being etched. Etch stabilizing ions 37 are believed to chemically combine, for example, with hydrogen micro-bubbles and/or attack or inhibit other undesirable etch reaction product so that they no longer significantly interfere with the arrival of fresh etch reagent or otherwise degrade etch interface 28', and therefore no longer significantly disrupt the etching process. Thus, as used herein, the term "etch stabilizing ion", singular or plural, is intended to refer generally to ions or atoms introduced into a substrate to be etched, which are released at the etch interface as the substrate is etched and prevent or reduce formation of etchant blocking gas curtains or etch inhibiting by-products or both, at the etch interface. Use of etch stabilizing ions 37 greatly improves the ability to control etching of shallow trenches and micro-cavities 26 in electronic substrates 20, especially SC substrates in which other devices and/or interconnects, and/or ICs and/or MEMS elements already are or will be incorporated. This is a significant advance in the art.

It is known that the etching rate of solids can be enhanced by abrading or damaging the surface prior to etching. Ion implantation is a known method of inducing surface damage. However, in the present situation, merely damaging substrate surface 21-5 (e.g., by ion implantation) prior to etching does not solve the problem of controlled etching of trenches 26, but in fact makes the overall process harder to control by, among other things, increasing the etching speed. What is needed is a means of stabilizing the etch rate, so that it is no longer erratic. It has been found that for silicon and other type IV semiconductors, this stabilization can be accomplished by, for example, using fluorine for Implant 34. Implanted fluorine ions 37 released during etching can combine with hydrogen micro-bubbles to form hydrofluoric acid (HF), thereby disrupting the micro-bubble gas curtain. Further, the resulting hydrofluoric acid (HF) can attack oxide containing etch products that may be formed at etch interface 28' by, for example, the TMAH etchant. This combination of effects substantially stabilizes the etch process so that the previously observed etch instabilities are no longer significant. Other elements having an equivalent effect during etching of exposed interface 28' of portion 36 of substrate 20 may also be used. Any etching speed increase due to surface damage associated with the ion implantation (e.g., of fluorine) is mitigated by using relatively dilute TMAH concentrations for etching trenches or micro-cavities 26.

Fluorine, implant energies in the range of about 5 KeV to 1 MeV and doses in the range of about 1E14 per $cm^2$ to 1E16 per $cm^2$ are useful, implant energies in the range of about 5 KeV to 100 KeV and doses in the range of about 5E14 per $cm^2$ to 7E15 per $cm^2$ are convenient, and implant energies in the range of about 5 KeV to 30 KeV and doses in the range of about 1E15 per $cm^2$ to 5E15 per $cm^2$ are preferred, but other doses and energies may also be used. Fluorine concentrations greater than about 5E18 ions/$cm^3$ are useful. In a preferred embodiment, the fluorine concentration was about 8E19 ions/$cm^3$ proximate surface 21-5, rising to a peak concentration of about 6E20 ions/$cm^3$ about 0.03 microns below surface 21-5 and decreasing to lower levels at greater depths into substrate 20. Stated another way, for trenches or micro-cavities of depth 27 of the order of a few micrometers, depth 38 of etch stabilization ions (e.g., fluorine) 37 beneath surface 21-5 is usefully in the range of about 1 to 2000 nanometers, conveniently in the range of about 1 to 450 nanometers and preferably in the range of about 1 to 155 nanometers, but other depths may also be used, depending upon desired depth 27 of trench 26 (see FIG. 1). Structure 304 results from manufacturing stage 204.

In further embodiments, it is desirable to use chain implants, that is, implants at different energies. Such chain implants result in a distributed concentration of etch stabilizing ion 37 at various depths 38, as indicated for example by dashed lines 37-1, 37-2, 37-3 (collectively 37) of FIG. 4. This has the effect of distributing etch stabilizing ions 37 at different depths 38-1, 38-2, 38-3 (collectively 38) from surface 21-5, so that as etching proceeds, a fresh supply of etch stabilizing ions is available at etch interface 28' as a function of depth. That is, as more and more substrate material is removed from interface 28' by the etching process, more and more of implanted etch stabilization ions 37 are uncovered and available to stabilize the etch process. (This is illustrated schematically in manufacturing stages 205 and 206 of FIGS. 5-6.) In this way, the advantages provided by a shallow implant for use in controlled etching of shallow trenches or micro-cavities, may be extended to trenches and micro-cavities of various depths. As will be explained later, the use of etch stabilizing ions 37 also significantly improves surface roughness of the etched trenches 26. This is very useful.

While ion implantation is a preferred means of providing etch stabilizing ions 37 at various depths 38 below surface 21-5 of substrate 20, persons of skill in the art will understand that other means for introducing such etch stabilization ions into portion 36 of substrate 20 may also be used in still other embodiments. Deposition, thermal diffusion, and gas phase doping are non-limiting examples of such alternative means of introducing etch stabilization ions 37. Accordingly, references to "providing" or "introducing" such etch stabilization ions 37 into substrate 20 herein and in the claims that follow are intended to include such alternative means. While in a preferred embodiment, it is preferable to introduce etch stabilization ions 37 into portion 36 of substrate 20 underlying etch window 24 after etch window 24 has been formed, this is not essential. In yet other embodiments, etch stabilization ions 37 may be introduced, for example, into surface 21-1 of substrate 20 more generally and etch window 24 formed after introduction of etch stabilization ions 37. This also produces the desired situation wherein etch stabilization ions 37 are present in portion 36 of substrate 20 underlying etch window 24 prior to the etching stages illustrated in FIGS. 5-7 and in step 710 of method 700 of FIG. 8. Either arrangement is useful. This alternative embodiment is described in more detail in connection with FIG. 8

Figure 5:
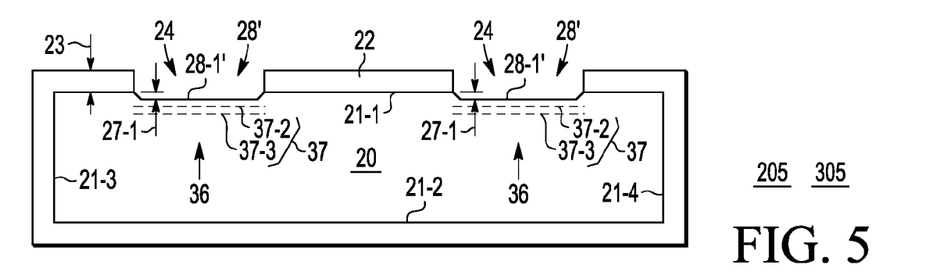
Figure 6:
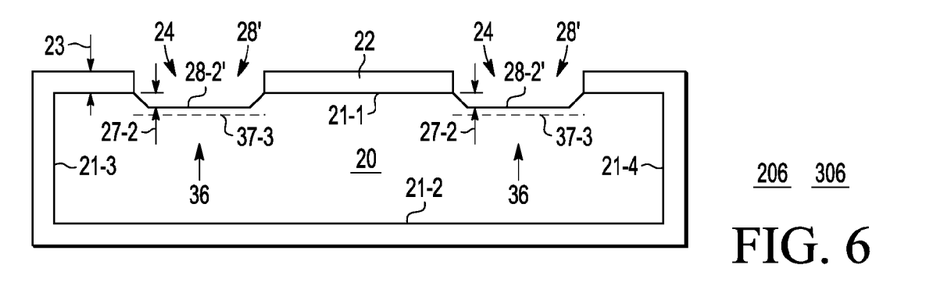

Referring now to manufacturing stage 205 of FIG. 5, trench 26 is partially etched into surface 21-5 of SC wafer 20 exposed in etch mask opening 24 of dielectric layer 22. Etch interface 28-1' at depth 27-1' below initial surface 21-5 is shown. Structure 305 results from manufacturing stage 205. Referring now to manufacturing stage 206 of FIG. 6, etching of trench or micro-cavity 26 continues, reaching etch interface 28-2' at depth 27-2' below interface 28-1' of FIG. 5. Dielectric layer 22 (and optionally mask 30) protects the remainder of wafer 20 while trench or micro-cavity 26 is being etched. It has been found that the state (e.g., roughness, smoothness, pitting or faceting) of interior surfaces 28 of finished trench 26, as well as the etch rate, control of depth 27, and other features of trench 26 are affected by how trench 26 is etched. Further details concerning the preferred etching process are explained in connection with FIGS. 8-9. Structure 306 results from manufacturing stage 206.

Figure 7:
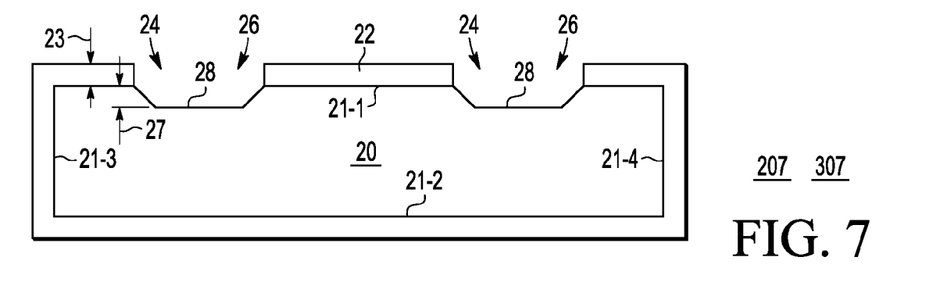

In manufacturing stage 207 of FIG. 7, etching of trench 26 to final depth 28 has been completed. Dielectric layer 22 may be left in place or removed depending upon what post-etch processing is desired. Where dielectric layer 22 comprises silicon dioxide, an etchant comprising hydrofluoric acid is useful, but other reagents and etching procedures well known in the art may also be used. Structure 307 results from manufacturing stage 207. In other embodiments, dielectric layer 22 may be left in place depending upon the nature of the circuits, devices and/or MEMS elements included or to be included in substrate 20. Structure 307 of FIG. 7 may be subjected to a variety of post etching manufacturing stages appropriate to the intended function of the ICs or devices or MEMS elements included or to be included in or on substrate 20 and the use being made of trench(es) 26 therein. Similarly, wafer 20 of FIGS. 1-7 may be subjected to a variety of pre-etching manufacturing stages appropriate to the intended function of the ICs or devices or MEMS elements included or to be included in substrate 20 and the use being made of trench or trenches 26 therein. Such variations will be understood by those of skill in the art.

Figure 8:
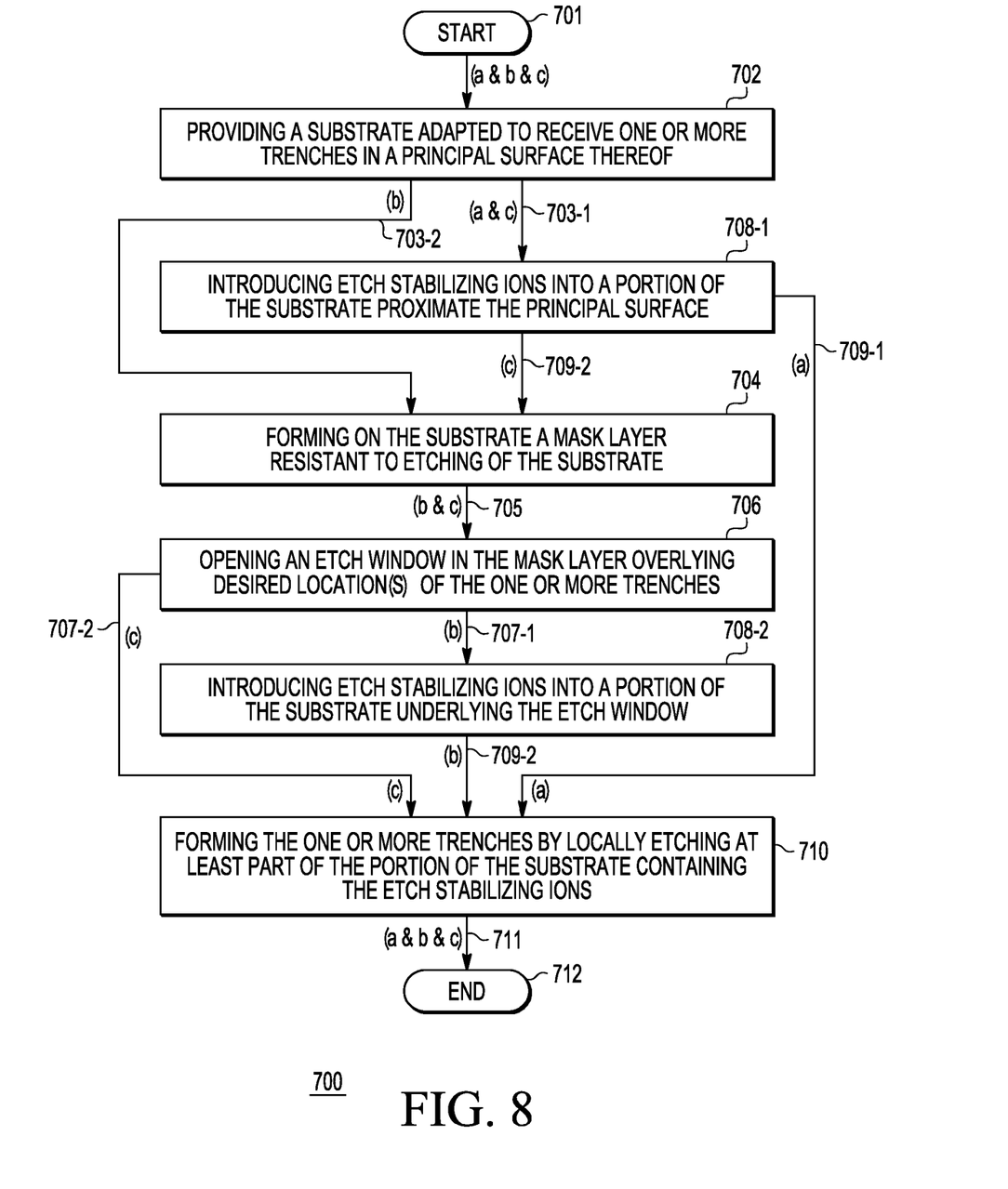
FIG. 8 is a simplified block diagram of a method of producing trenches by etching substrates as illustrated in FIGS. 1-7, according to further embodiments of the invention.
Figure 9:
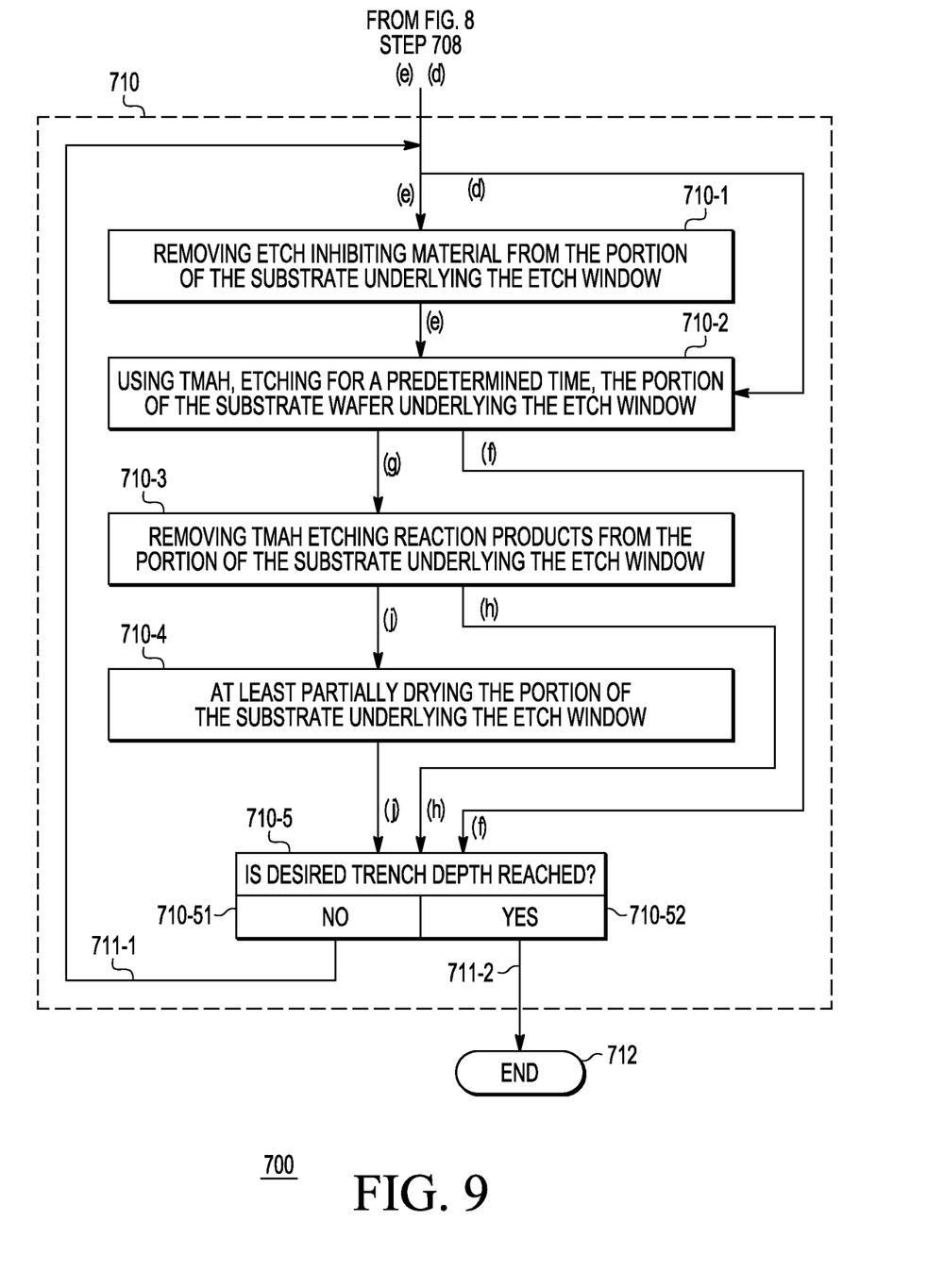
FIG. 9 is a simplified block diagram of a portion of the method of FIG. 8 showing additional details according to still further embodiments of the invention.

FIG. 8 is a simplified block diagram of method 700 of producing trenches 26 by etching substrates 20 as illustrated in FIGS. 1-7, according to further embodiments of the invention, and FIG. 9 is a simplified block diagram of a portion (e.g., step 710) of method 700 of FIG. 8 showing additional details according to still further embodiments of the invention. For economy of illustration, in the discussion of FIGS. 8-9 and in the claims that follow, the terms "trench" (singular or plural) is intended to include "micro-cavity" (singular or plural). Referring now to FIG. 8, method 700 begins with START 701 and initial step 702 wherein there is provided (e.g., see FIG. 2) a substrate (20) adapted to receive one or more trenches (26) in a principal surface (21-1) thereof. It will be understood by those of skill in the art that substrate 20 can have various SC devices and/or circuits and/or various MEMS elements (not shown) included therein before or after step 702. Method 700 comprises several alternate flows (a), (b), and (c). All such embodiments are useful. For example, method flow:

(a) Comprises step 702, path 703-1 to step 708-1, path 709-1 to step 710 and path 711 to END 712;

(b) Comprises step 702, path 703-2 to step 704, path 705 to step 706, path 707-1 to step 708-2, path 709-2 to step 710 and path 711 to END 712; and (c) Comprises step 702, path 703-1 to step 708-1, path 709-2 to step 704, path 705 to step 706, path 707-2 to step 710 and path 711 to END 712.

Referring now to flow (a), following step 702, in step 708-1 etch stabilizing ions (37) (e.g., fluorine) are introduced into a portion (36) of the substrate (20) proximate the principal surface (21-1) (e.g., see FIG. 4). In subsequent step 710, the one or more trenches (26) are formed by locally etching at least part of the portion (36) of the substrate (20) containing the etch stabilizing ions (37) (e.g., see FIGS. 5-7). Flow (a) of method 700 then proceeds to END 712.

Figure 2:
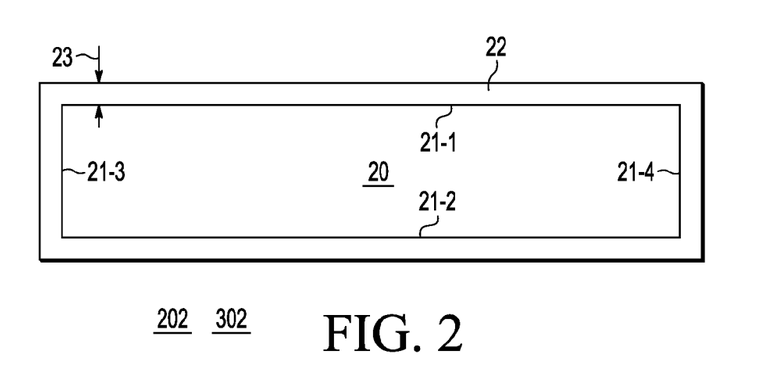
FIGS. 2-7 are simplified cross-sectional views of the substrate of FIG. 1 during various stages of manufacture, according to an embodiment of the invention.

Referring now to flow (b), following step 702, in step 704 a mask layer (22) resistant to etching of the substrate (20) is formed on the substrate (20) (e.g., see FIG. 2). In step 706, an etch window (24) is opened in the mask layer (22) overlying the desired location(s) of the one or more trenches (26) (e.g., see FIG. 3). In step 708-2, etch stabilizing ions (37) (e.g., fluorine) are introduced into a portion (36) of the substrate (20) underlying the etch window (24) (e.g., see FIG. 4). In subsequent step 710, the one or more trenches (26) are formed by locally etching at least part of the portion (36) of the substrate (20) containing the etch stabilizing ions (37) (which underlie the etch window 24, e.g., see FIGS. 5-7). Flow (b) of method 700 then proceeds to END 712.

Referring now to flow (c), following step 702, in step 708-1 etch stabilizing ions (37) (e.g., fluorine) are introduced into a portion (36) of the substrate (20) proximate the principal surface (21-1) (e.g., see FIG. 4). In step 704 a mask layer (22) resistant to etching of the substrate (20) is formed on the substrate (20) (e.g., see FIG. 2). In step 706, an etch window (24) is opened in the mask layer (22) overlying the desired location(s) of one or more trenches (26) (e.g., see FIG. 3). In subsequent step 710, one or more trenches (26) are formed by locally etching at least part of the portion (36) of the substrate (20) containing the etch stabilizing ions (37) (e.g., see FIGS. 5-7). Flow (c) of method 700 then proceeds to END 712.

FIG. 9 is a simplified block diagram of a portion (e.g., step 710) of method 700 of FIG. 8, showing additional details according to still further embodiments of the invention. Step 710-1 of FIG. 9 follows from step 708-1 or step 708-2 of FIG. 8. Method 700 of FIG. 9 has several useful method flows (d)-(j) to be described later. For convenience of explanation, individual method steps 710-1, 710-2, 710-3, 710-4 and 710-5 are described and various method flows (d)-(j) in which some or all of these steps may be used are then explained.

Referring now to FIG. 9, step 710-1 is desirable but not essential. In step 710-1, etch inhibiting material (e.g., native oxide that may have formed on surface 21-5 during preceding steps) on the portion (36) of the substrate (20) underlying the etch window (24) is removed. Where the substrate 20 comprises silicon, it is found that a hydrofluoric acid solution is a suitable reagent for removing the typical etch inhibiting material (e.g., native oxide) that may have formed during previous operations. Volumetric concentrations $H_2O:HF$ of water ($H_2O$) to hydrofluoric acid (HF) are usefully in the range of about $H_2O:HF=500:1$ to 25:1, more conveniently in the range of about $H_2O:HF=200:1$ to 50:1, and preferably in the range of about $H_2O:HF=125:1$ to 75:1, but other concentrations may also be used. $H_2O:HF$ etch times on the order of about 300 seconds are desirable, but longer or shorter etch times may also be used.

In step 710-2, TMAH is desirably used for a predetermined time to etch the portion (36) of the substrate (20) underlying the etch window (24). Relatively dilute TMAH solutions are useful. A concentration range of about 1 to 40 weight percent of TMAH in water is acceptable, with about 2 to 20 weight percent being more convenient and about 2 to 3 weight percent being preferred, but larger or smaller concentrations can also be used. TMAH etch times in the range of about 120 to 180 seconds, are desirable, but longer or shorter etch times may also be used.

Step 710-3 is desirable but not essential. In step 710-3, any residual TMAH etch reaction products are removed from the portion (36) of substrate (20) underlying the etch window (24). A cleaning solution comprising $H_2O:H_2O_2:NH_4OH$ in volumetric ratio of about 5:1:1 to 50:2:1 is useful, in volumetric ratio of about 10:2:1 to 50:2:1 is convenient, and in volumetric ratio of about 30:2:1 to 50:2:1 is preferred, but other reagents and concentrations may also be used, for example, depending upon the substrate materials. Cleaning etch times in the range of about 10 minutes are desirable, but longer or shorter cleaning etch times may also be used. Megasonic or ultrasonic energy may be used to assist in the cleaning process but is not essential. Step 710-4 is desirable but not essential. In step 710-4, the portion (36) of the substrate (20) underlying the etch window (24) is at least partially dried, for example, by exposure to clean dry air or nitrogen or heat lamps or other heat source or a combination thereof, but other drying methods may also be used.

In query step 710-5, it is determined whether or not the desired depth (27) of trench (26) has been reached. If NO outcome 710-51 is obtained, then manufacturing step 710 follows path 711-1 and returns to step 710-1, whence some or all of steps 710-2, 710-3, 710-4, 710-5 are repeated until YES outcome 710-52 is obtained, whereupon method 700 follows path 711-2 to END 712. In a preferred embodiment, the TMAH etch time in step 710-2 may be reduced during subsequent iterations 710-1, 710-2, 710-3, 710-4, 710-5, as for example, to about 30 to 60 seconds, but other TMAH etching times may also be used. It is found that in order to obtain trench 26 of depth 27 of about 3 micrometers, that some or all of iteration 710-1, 710-2, 710-3, 710-4, 710-5, and 711-1 are desirably repeated at least two times and preferably two to four times. By modifying the number of iterations, depth 27 of trench or trenches 26 may be adjusted to suit the design requirements. Further, using chain implants to place etch stabilization ions 37 at different depths 38, also facilitates obtaining trenches of various depths.

As noted above, although preferred, not all of steps 710-1, 710-2, 710-3, 710-4, and 710-5 are essential. According to the embodiment of flow (d), method 700 advances directly from step 708 of FIG. 8 (or from "repeat" path 711-1) to TMAH etching step 710-2, while according to the embodiment of flow (e), method 700 advances from step 708 of FIG. 8 (or from "repeat" path 711-1) first to cleaning step 710-1 wherein any etch inhibiting material on the portion (36) of the substrate (20) underlying the etch window (24) is removed and then to TMAH etching step 710-2.

According to the embodiment of flow (f) following TMAH etching step 710-2, method 700 may proceed directly to query 710-5, and then to "repeat" path 711-1 or to path 711-2 to END 712 depending upon outcomes 710-51 or 710-52 of query 710-5, as has been previously explained. According to the embodiment of flow (g) following TMAH etching step 710-2, method 700 advances first to TMAH reaction products removal step 710-3. According to the embodiment of flow (h) method 700 advances from TMAH reaction products removal step 710-3 to query 710-5 and the outcome thereof already explained. According to flow (j) method 700 advances from TMAH reaction products removal step 710-3 first to drying step 710-4 and then to query step 710-5 and the outcome thereof already explained.

Any of method flows (d)-(j) are useful and may be combined with flows (a)-(c) explained in conjunction with FIG. 7. Further flows (d)-(j) may be varied during "repeat" iterations following path 711-1. For example and not intended to be limiting, initial cleaning step 710-1 may be included on a first pass through step 710, and depending upon the outcome of query 710-5, may be omitted on a second pass or iteration. In a further embodiment, query step 710-5 may be performed before drying step 710-4, and if the desired trench depth 27 has not yet been reached, drying step 710-4 may be omitted before returning via repeat path 711-1 to repeat flows (d) or (e). In still another embodiment, where step 710-4 has been performed following a first TMAH etching step 710-3 and query 710-5 determines that at least another iteration (e.g., a "repeat") is needed, then initial cleaning step 710-1 may be omitted on the second and/or subsequent iterations. All such variations are useful.

In addition to facilitating obtaining trenches 26, introducing etch stabilizing ions 37 in substrates 20 (e.g., see step 708) followed by the multi-stage etch process (e.g., see step 710), also improves the surface roughness of resulting trench 26. For example, the surface roughness of three micron deep trenches prepared by various etching procedures is compared below:

(1) Utilizing method 700 of FIGS. 8-9 including both stabilization ion (e.g., fluorine) implant step 708 and sequential (e.g., 2-step) TMAH etching step 710, the RMS surface roughness was in the range of about 40-60 nanometers;

(2) Utilizing a non-sequential (e.g., one-step) TMAH etch process with no stabilization ion (e.g., no fluorine) implant, the RMS surface roughness was in the range of about 90-340 nanometers; and (3) Utilizing a sequential (2-step) TMAH etch process but with no stabilization ion (e.g., no fluorine) implant, the RMS surface roughness was in the range of about 130-170 nanometers.

The method of test (2) with no stabilization ion implant and only a one-step TMAH etch provided about three micrometer deep trenches that were, on the average about 80% to 580% rougher than the embodiment of the invention used in test (1). The method of test (3) with no stabilization ion implant and a 2-step TMAH etch provided about three micrometer deep trenches that were, on the average about 160% to 240% rougher than the embodiment of the invention used in test (1). Method 700 for providing trenches that combines the use of etch stabilization ions 37 plus a multi-step (e.g., 2 or more iterations) TMAH etch, not only allows much improved control over the process so as to be able to consistently provide trenches 26 but also provides trenches 26 with much improved surface roughness. This is a significant advance in the art.

According to a first embodiment, there is provided a method for providing an electronic product containing one or more trenches (26), comprising, providing a substrate (20) having a principal surface (21-1), introducing etch stabilizing ions (73) into a portion (36) of the substrate (20) proximate the principal surface (21-1), and forming the one or more trenches (26) by etching away at least part of the portion (36) of the substrate (20) containing the etch stabilizing ions (37). According to a further embodiment, the method further comprises, forming on the principal surface (21-1) a mask layer (22) resistant to etching of the substrate (20), opening an etch window (24) in the mask layer (22) overlying the desired location(s) of the one or more trenches (26), and etching away the at least part of the portion (36) of the substrate (20) containing the etch stabilizing ions (37) through the etch window (24). According to a still further embodiment, etching is carried out using tetra-methyl-ammonium hydroxide (TMAH). According to a yet further embodiment, the method further comprises after etching using TMAH, removing TMAH etching reaction products from the portion (36) of the substrate (20). According to a still yet further embodiment, the substrate (20) comprises silicon and the etch stabilizing ions (37) comprise fluorine. According to a yet still further embodiment, the etch stabilizing ions (37) are introduced by ion implantation (34). According to another embodiment, the ion implantation (34) is provided at a fluorine dose in the range of about 1E14 per $cm^2$ to 1E16 per $cm^2$. According to a still another embodiment, the ion implantation (34) is performed at one or more energies in the range of about 5 KeV to 1 MeV. According to a yet another embodiment, the ion implantation (34) is provided at more than one energy.

According to a second embodiment, there is provided a method for etching one or more trenches (26) in a substrate (20), comprising, providing a substrate (20) adapted to receive the one or more trenches (26) therein, forming on the substrate (20) a mask layer (22) resistant to etching of the substrate (20), opening an etch window (24) in the mask layer (22) overlying the desired location(s) of the one or more trenches (26), introducing etch stabilizing ions (37) into a portion (36) of the substrate (20) underlying the etch window (24), and forming the one or more trenches (26) by etching at least part of the portion (36) of the substrate (20) underlying the etch window (24) containing the etch stabilizing ions (37). According to a further embodiment, the substrate (20) comprises silicon and the etch stabilizing ions (37) comprise fluorine. According to a still further embodiment, the etch stabilizing ions (37) are introduced by ion implantation (34). According to a yet further embodiment, the ion implantation (34) is provided to a doping concentration in the substrate greater than 5E18 per $cm^3$. According to a still yet further embodiment, the ion implantation (34) is performed at an energy in the range of about 5 KeV to 1 MeV. According to a yet still further embodiment, the ion implantation (34) is provided at more than one energy to establish the concentration of implanted ions as a function of depth in the portion (36). According to another embodiment, the step of forming one or more trenches (26) comprises, etching the portion (36) of the substrate (20) underlying the etch window (24) using tetra-methyl-ammonium hydroxide (TMAH). According to a still another embodiment, the method further comprises removing TMAH etching reaction products from the portion (36) of the substrate (20) underlying the etch window (24).

According to a third embodiment, there is provided a method for forming a trench (26) in a principle surface (21-1) of a silicon wafer (20), comprising, implanting fluorine ions (37) in a portion (36) of the silicon wafer (20) proximate the principal surface (21-1), and forming the trench (26) by locally etching the portion (36) of the silicon wafer (20) containing the fluorine ions (73). According to a further embodiment, the etching step comprises at least two silicon etching steps (710-2) separated by one or more cleaning steps (710-3, 710-1). According to a still further embodiment, the at least two silicon etching steps (710-2) use a tetra-methyl-ammonium hydroxide (TMAH) etchant.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for providing an electronic product containing one or more trenches, comprising:
    providing a substrate comprising a semiconductor material body having a principal surface;
    forming a dielectric layer over the principal surface of the semiconductor material body;
    producing at least one etch window in the dielectric layer;
    introducing etch stabilizing ions into a portion of the semiconductor material body of the substrate proximate the principal surface and through the etch window in the dielectric layer, the etch stabilizing ions consisting essentially of fluorine ions implanted to a fluorine ion concentration greater than 5E18 ions per $cm^3$; and
    forming the one or more trenches by etching away at least part of the semiconductor material body of the substrate containing the etch stabilizing ions through the etch window in the dielectric layer, the one or more trenches each comprising a cavity or micro-cavity extending into, but not through the semiconductor material body of the substrate, and having a width between about 500 and 1200 micrometers.

2. The method of claim 1, wherein etching is carried out using tetra-methyl-ammonium hydroxide (TMAH).

3. The method of claim 2, further comprising after etching using TMAH, removing TMAH etching reaction products from the portion of the semiconductor material body of the substrate.

4. The method of claim 1, wherein the body of semiconductor material comprises silicon.

5. The method of claim 1, wherein introducing the etch stabilizing ions comprises implanting the portion of the semiconductor material body with fluorine ions at a fluorine dose in the range of about 1E14 per $cm^2$ to 1E16 per $cm^2$.

6. The method of claim 1, wherein introducing the etch stabilizing ions comprises implanting the portion of the semiconductor material body with fluorine ion at one or more energies in the range of about 5 KeV to 1MeV.

7. the method of claim 1, wherein introducing the etch stabilizing ions comprises implanting the portion of the semiconductor material body with fluorine ions at more than one energy.

8. A method for etching one or more trenches in a substrate, comprising:
    providing a substrate adapted to receive the one or more trenches therein;
    forming on the substrate a mask layer resistant to etching of the substrate;
    opening an etch window in the mask layer overlying the desired location of the one or more trenches;
    introducing fluorine ions into a portion of the substrate comprising a semiconductor material and underlying the etch window such that the portion of the substrate comprising the semiconductor material has a fluorine ion concentration greater than 5E18 per $cm^3$; and
    forming the one or more trenches by etching at least part of the portion of the substrate comprising the semiconductor material, underlying the etch window, and containing the fluorine ions, the one or more trenches each comprising a cavity or micro-cavity having a width between about 100 and 2000 micrometers and a depth between about 2 and about 50 micrometers.

9. The method of claim 8, wherein the semiconductor material comprises silicon.

10. The method of claim 9, wherein the fluorine ions are introduced by ion implantation.

11. The method of claim 10, wherein the ion implantation is performed at an energy in the range of about 5 KeV to 1MeV.

12. The method of claim 11, wherein the ion implantation is provided at more than one energy to establish the concentration of implanted fluorine ions as a function of depth in the portion of the substrate comprising a semiconductor material.

13. The method of claim 9, wherein the step of forming one or more trenches comprises, etching the portion of the substrate comprising a semiconductor material and underlying the etch window using tetra-methyl-ammonium hydroxide (TMAH).

14. The method of claim 13, further comprising removing TMAH etching reaction products from the portion of the substrate comprising a semiconductor material and underlying the etch window.

15. The method of claim 8 wherein introducing the etch stabilizing ions comprises introducing etching stabilizing ions consisting essentially of fluorine ions into the portion of the semiconductor material body.

16. A method for forming a trench in a principle surface of a silicon wafer, comprising:
    forming a dielectric layer over the principal surface of the silicon wafer;
    producing an etch window in the dielectric layer;
    implanting fluorine ions through the etch window and into a silicon-comprising portion of the silicon wafer proximate the principal surface; and
    forming the trench by locally etching through the etch window the silicon-comprising portion of the silicon wafer containing the fluorine ions using tetra-methylammonium hydroxide (TMAH), the trench comprising a cavity or micro-cavity extending into, but not through the silicon wafer;

wherein the etching step comprises at least two silicon etching steps separated by one or more cleaning steps.

17. The method of claim 16 wherein the etch window is produced to have a width and length generally corresponding to the desired width and length of the trench.

* * * * *